(12) United States Patent
Nagano

(10) Patent No.: US 10,063,040 B1
(45) Date of Patent: Aug. 28, 2018

(54) ELECTRICAL CONNECTION BOX AND WIRE HARNESS

(71) Applicant: Yazaki Corporation, Tokyo (JP)

(72) Inventor: Masayuki Nagano, Shizuoka (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 15/942,745

(22) Filed: Apr. 2, 2018

(30) Foreign Application Priority Data

Apr. 25, 2017 (JP) ................... 2017-086396

(51) Int. Cl.
| | |
|---|---|
| *H05K 5/00* | (2006.01) |
| *H02G 3/08* | (2006.01) |
| *H05K 5/02* | (2006.01) |
| *B60R 16/023* | (2006.01) |
| *H01B 7/00* | (2006.01) |

(52) U.S. Cl.
CPC ......... *H02G 3/083* (2013.01); *B60R 16/0239* (2013.01); *H05K 5/006* (2013.01); *H05K 5/0021* (2013.01); *H05K 5/0069* (2013.01); *H05K 5/0217* (2013.01); *H05K 5/0239* (2013.01); *H01B 7/0045* (2013.01)

(58) Field of Classification Search
CPC .... H05K 5/0021; H05K 5/0239; H05K 5/006; H05K 5/0069; B60R 16/0239
See application file for complete search history.

(56) References Cited

U.S. PATENT DOCUMENTS

| | | | |
|---|---|---|---|
| 9,144,163 B2* | 9/2015 | Lu ........................ | G11B 33/027 |
| 9,485,336 B2* | 11/2016 | Shinoda ............... | H05K 5/0239 |
| 2006/0033635 A1* | 2/2006 | Chen ...................... | B60R 25/10 |
| | | | 340/693.6 |
| 2015/0165982 A1 | 6/2015 | Okitsu | |
| 2015/0250070 A1* | 9/2015 | Anami ................. | H05K 5/0239 |
| | | | 361/752 |
| 2015/0305184 A1* | 10/2015 | Tokumasu ........... | H05K 5/0221 |
| | | | 312/223.1 |
| 2016/0366776 A1* | 12/2016 | Tollefsbol ............ | H05K 5/0213 |
| 2017/0127542 A1* | 5/2017 | Schmidt ............... | H05K 5/0239 |
| 2017/0164496 A1* | 6/2017 | Imaizumi .............. | H01R 12/58 |

FOREIGN PATENT DOCUMENTS

JP 2015-117742 A 6/2015

* cited by examiner

*Primary Examiner* — Hung V Ngo
(74) *Attorney, Agent, or Firm* — Sughrue Mion, PLLC

(57) ABSTRACT

An electrical connection box applicable to a wire harness includes a case including a housing space that is formed inside by a first member and a second member facing each other along an opposite direction and that houses a substrate, and a locking part that is locked to a fixing object surface. The first member includes a first protrusion, and the second member includes a second protrusion formed to face the first protrusion and an abutting part that abuts on the fixing object surface in a state in which the locking part is locked to the fixing object surface, generates a pushing force along the opposite direction, and has the substrate sandwiched between the first protrusion and the second protrusion.

7 Claims, 6 Drawing Sheets

FIG.6
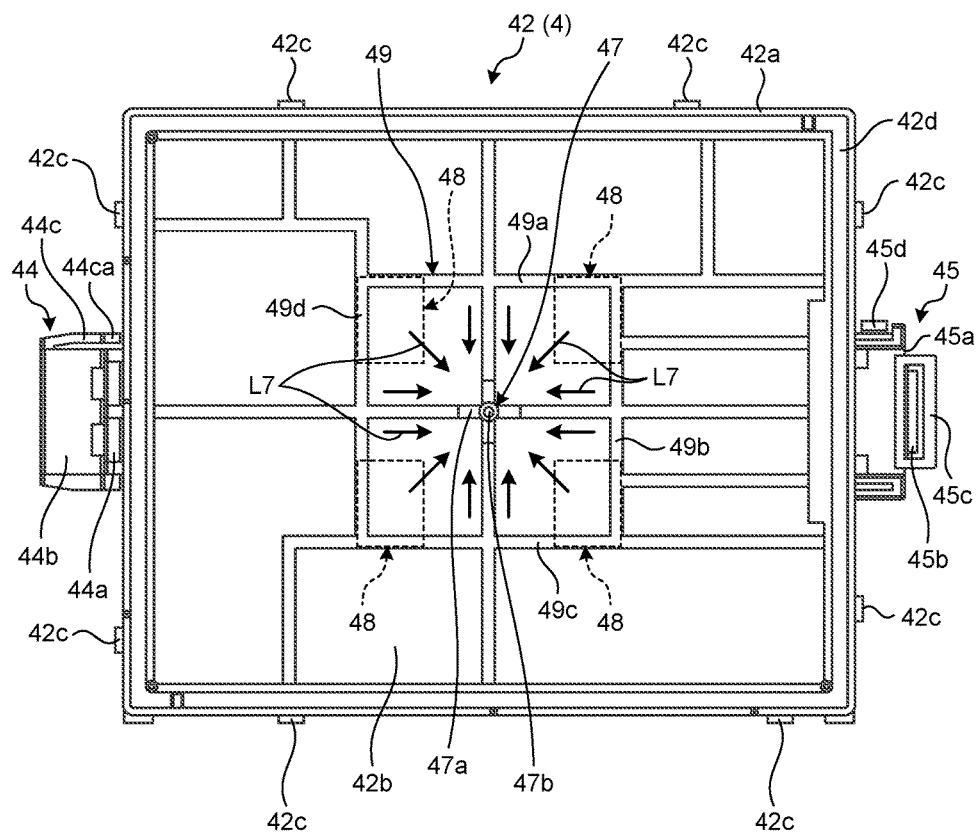
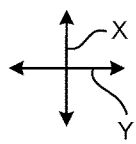

ELECTRICAL CONNECTION BOX AND WIRE HARNESS

CROSS-REFERENCE TO RELATED APPLICATION(S)

The present application claims priority to and incorporates by reference the entire contents of Japanese Patent Application No. 2017-086396 filed in Japan on Apr. 25, 2017.

BACKGROUND OF THE INVENTION

1. Field of the Invention

The present invention relates to an electrical connection box and a wire harness.

2. Description of the Related Art

As an example of the conventional electrical connection box used for a wire harness mounted on a vehicle or the like, for example, Japanese Patent Application Laid-open No. 2015-117742 discloses an attachment structure for an on-vehicle device that includes an engagement arm and an engagement hole. The engagement arm is provided to a case of the on-vehicle device, and is configured to be displaceable in a length direction of the case. The engagement hole is provided to a bracket fixed to a vehicle body side, and the engagement arm is engaged in the engagement hole. This attachment structure for the on-vehicle device is configured so that the engagement arm inserted in the engagement hole is elastically engaged with a side edge of the engagement hole, so as to attach the on-vehicle device to the bracket.

The attachment structure for the on-vehicle device according to Japanese Patent Application Laid-open No. 2015-117742 has room for further improvement in point of, for example, suppressing rattling of each part.

SUMMARY OF THE INVENTION

The present invention has been made in view of the above circumstances and an object of the present invention is to provide a electrical connection box and a wire harness that can suppress rattling.

In order to achieve the above mentioned object, an electrical connection box according to one aspect of the present invention includes a substrate provided with an electronic component; and a case including a housing space that is formed inside by a first member and a second member facing each other along an opposite direction and that houses the substrate, and a locking part that is locked to a fixing object surface intersecting with the opposite direction, wherein the first member includes a first protrusion formed to protrude into the housing space along the opposite direction, and the second member includes a second protrusion formed to face the first protrusion along the opposite direction and to protrude into the housing space, and an abutting part that is formed to protrude to a side opposite to the housing space along the opposite direction, abuts on the fixing object surface in a state in which the locking part is locked to the fixing object surface, generates a pushing force along the opposite direction, and sandwiches the substrate between the first protrusion and the second protrusion.

According to another aspect of the present invention, in the electrical connection box, it is possible to configure that a plurality of the abutting parts are provided at a position in which the abutting parts surround the second protrusion when viewed along the opposite direction.

According to still another aspect of the present invention, in the electrical connection box, it is possible to configure that the second member includes: a plate-shaped portion that is formed to have a plate-like shape, is provided with the second protrusion and the abutting part, and is bendable along the opposite direction by the pushing force generated by the abutting part; and a surrounding rib part that is provided at a position in which the surrounding rib part surrounds the second protrusion and overlaps with the abutting parts when viewed along the opposite direction, and is formed to protrude from the plate-shaped portion toward the housing space along the opposite direction.

According to still another aspect of the present invention, in the electrical connection box, it is possible to configure that a pair of the locking parts are provided to the second member sandwiching the abutting part along a direction intersecting with the opposite direction.

In order to achieve the above mentioned object, a wire harness according to still another aspect of the present invention includes a conductive wiring material; and an electrical connection box electrically connected to the wiring material, wherein the electrical connection box includes a substrate provided with an electronic component electrically connected to the wiring material, and a case including a housing space that is formed inside by a first member and a second member facing each other along an opposite direction and that houses the substrate, and a locking part that is locked to a fixing object surface intersecting with the opposite direction, the first member includes a first protrusion formed to protrude into the housing space along the opposite direction, and the second member includes a second protrusion formed to face the first protrusion along the opposite direction and to protrude into the housing space, and an abutting part that is formed to protrude to a side opposite to the housing space along the opposite direction, abuts on the fixing object surface in a state in which the locking part is locked to the fixing object surface, generates a pushing force along the opposite direction, and sandwiches the substrate between the first protrusion and the second protrusion.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 6 is a front view illustrating a schematic structure of a lower case of the electrical connection box according to the embodiment.

DETAILED DESCRIPTION OF THE PREFERRED EMBODIMENTS

An embodiment according to the present invention is described below in detail with reference to drawings. The present invention is not limited by the present embodiment. The components in the embodiment described below include a component that is easily replaced by a person skilled in the art or that is substantially the same.

Figure 1:
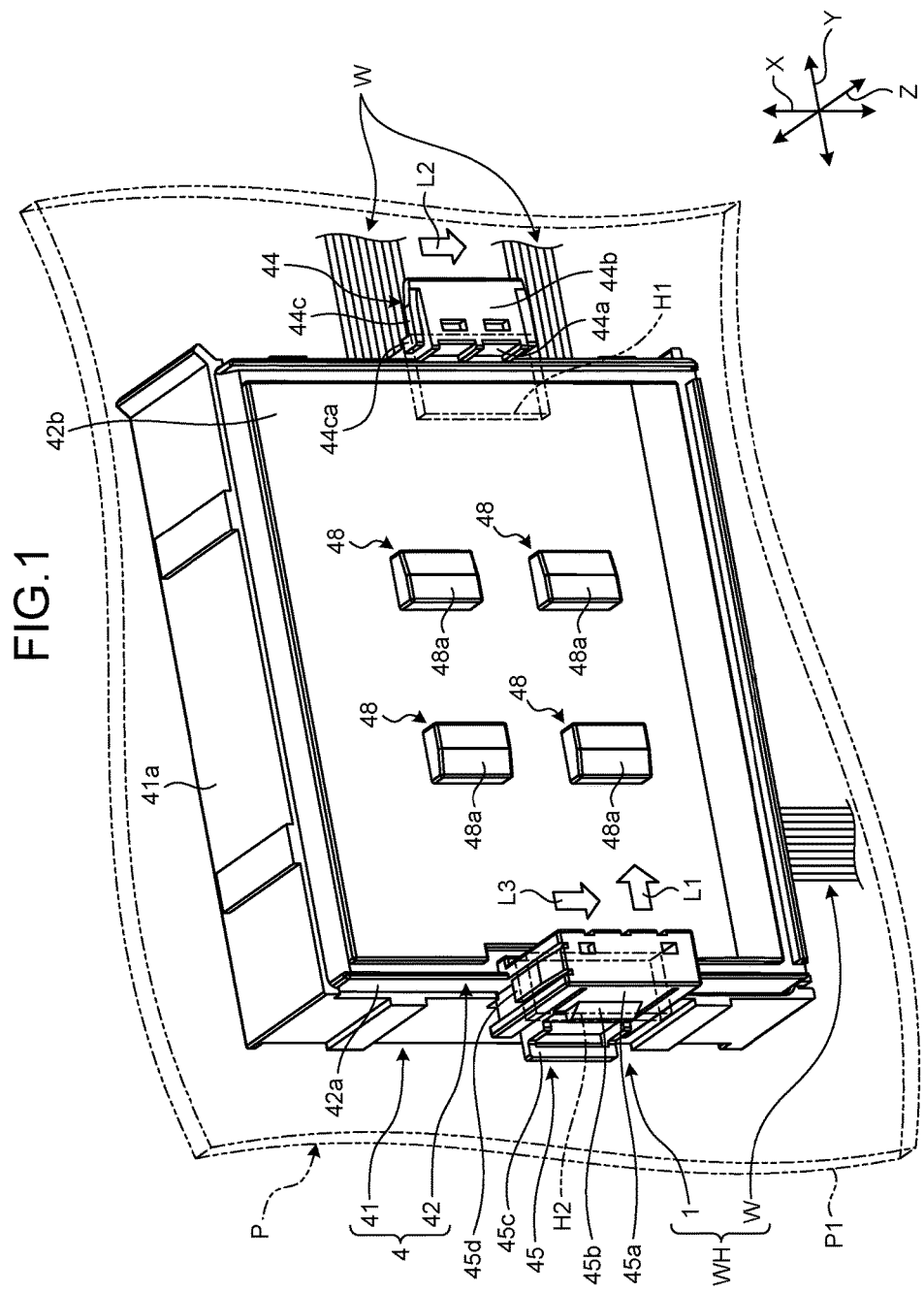
FIG. 1 is a perspective view illustrating a schematic structure of an electrical connection box according to an embodiment.
Figure 4:
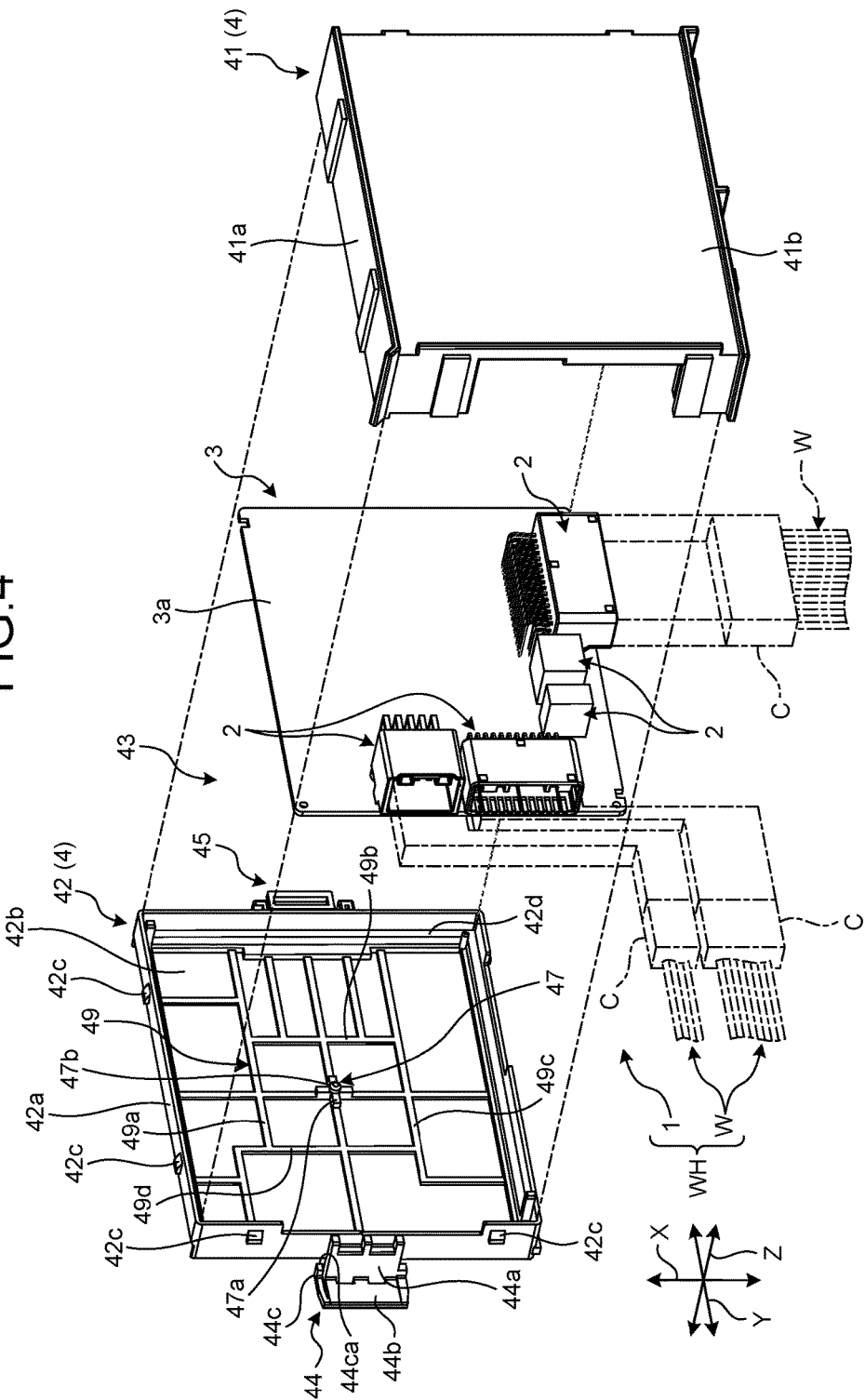
FIG. 4 is an exploded perspective view illustrating a schematic structure of the electrical connection box according to the embodiment.

Note that a wiring material is partly illustrated with a solid line in FIG. 1, the wiring material is simplified and partly illustrated with a dash-dot line in FIG. 4, and in the other drawings, the illustration of the wire material is omitted. In addition, a panel provided with a fixing object surface is simplified and partly illustrated with a two-dot chain line in FIG. 1, the panel is partly illustrated with a solid line in FIG. 2, and in the other drawings, the illustration of the panel is omitted. In each drawing, some electronic components mounted on the substrate are illustrated and other electronic components are not illustrated. In the following description, among a first direction, a second direction, and a third direction that are intersecting with each other, the first direction is referred to as "height direction X", the second direction is referred to as "width direction Y", and the third direction is referred to as "thickness direction Z". Here, the height direction X, the width direction Y, and the thickness direction Z are orthogonal to each other. Typically, when the electrical connection box is mounted on a vehicle and the vehicle is on a horizontal plane, the height direction X is in a vertical direction, and the width direction Y and the thickness direction Z are in the horizontal direction. The thickness direction Z corresponds to an opposite direction where a main case and a lower case face each other, and the height direction X and the width direction Y correspond to an intersecting direction that intersects with the opposite direction. The directions used in the description below are the directions in a state in which the parts are assembled to each other and the electrical connection box is mounted on the vehicle, unless otherwise stated.

EMBODIMENT

Figure 2:
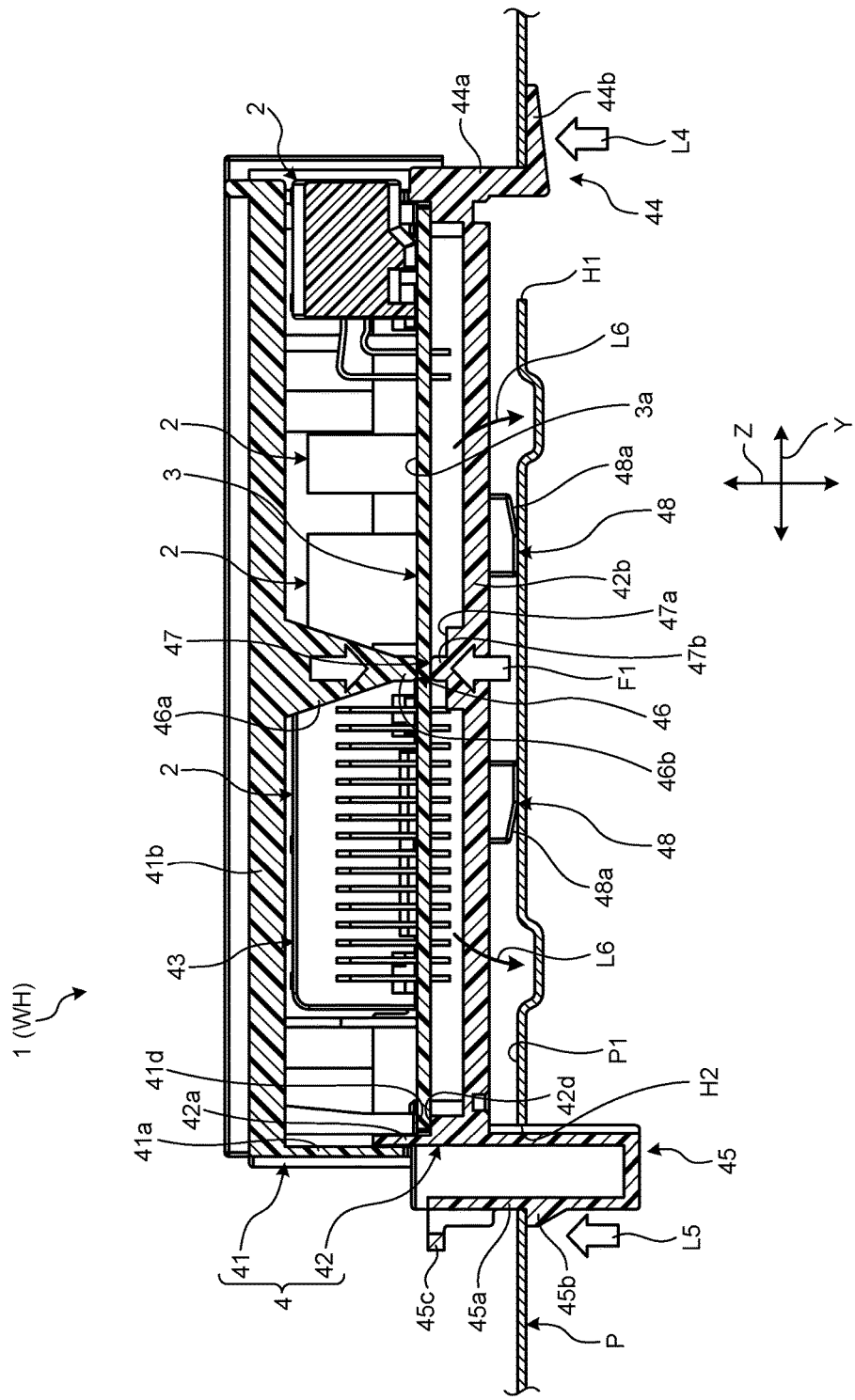
FIG. 2 is a cross-sectional view illustrating a schematic structure of the electrical connection box according to the embodiment.

An electrical connection box 1 according to the present embodiment illustrated in FIG. 1 and FIG. 2 is to be mounted on a vehicle such as an automobile, and incorporated in a wire harness WH. For example, the wire harness WH connects between devices mounted on the vehicle by bundling a plurality of wiring materials W used for supplying power and communicating signals into a collective component, and by connecting the wiring materials W with the devices using a connector and the like. The wire harness WH includes the conductive wiring material W and the electrical connection box 1 electrically connected to the wiring material W. The wiring material W is, for example, formed of a metal stick, an electric wire, or an electric wire bundle. The metal stick is formed by covering an outer side of a conductive stick-like member with an insulating covering part. The electric wire is formed by covering an outer side of a conductor part (core line) including a plurality of conductive metal wires with an insulating covering part. The electric wire bundle is a bundle of such electric wires. The wire harness WH is formed by bundling the wiring materials W, and to the wire harness WH, the electrical connection box 1 is electrically connected through, for example, a terminal or a connector at an end of the bundled wiring materials W. The wire harness WH may further include a grommet, a protector, or a fixing tool.

The electrical connection box 1 is to internally house electric components such as a connector, a fuse, a relay, a capacitor, a branching part, and an electronic control unit altogether. The electrical connection box 1 is installed in, for example, an engine compartment of a vehicle, or a cabin of a vehicle. The electrical connection box 1 is connected between a power source such as a battery and various electronic devices mounted in the vehicle through the wiring material W or the like. The electrical connection box 1 distributes electric power from the power source to various electronic devices in the vehicle. The electrical connection box 1 may also be called a junction box, a fuse box, a relay box, or the like, and in this embodiment, these are collectively referred to as the electrical connection box.

The electrical connection box 1 according to the present embodiment is a panel-fixed type electrical connection box that is fixed to a fixing object surface P1 of an attachment panel P. The attachment panel P is, for example, a vehicle structure member that forms a body, a bracket, or the like of the vehicle. The attachment panel P has a plate-like shape whose sides are in the height direction (vertical direction) X and the width direction Y. The plate thickness direction of the attachment panel P corresponds to the thickness direction Z. The fixing object surface P1 is a surface where the electrical connection box 1 is fixed. The fixing object surface P1 is formed on one side of the attachment panel P along the height direction X and the width direction Y, and intersects with (is orthogonal to) the thickness direction Z. The fixing object surface P1 may be either flat or uneven to such a degree that the electrical connection box 1 can be fixed. The fixing object surface P1 has a pair of locking holes H1, H2. The locking holes H1, H2 are locking object parts used to lock and fix the electrical connection box 1 to the fixing object surface P1. The locking holes H1, H2 are penetration holes penetrating the attachment panel P along the thickness direction Z. Here, the locking holes H1, H2 are formed as penetrating holes with an approximately rectangular shape. A pair of locking holes H1, H2 is disposed apart from each other along the width direction Y. The electrical connection box 1 according to the present embodiment is a panel-fixed type electrical connection box as described above, and by having a substrate 3 sandwiched, held, and housed for sure between a main case 41 as a first member and a lower case 42 as a second member, rattling is suppressed. The structure of the electrical connection box 1 is described below in detail with reference to each drawing.

The electrical connection box 1 according to the present embodiment includes electronic components 2, the substrate 3, and a case 4 as illustrated in FIG. 1, FIG. 2, FIG. 3, FIG. 4, and FIG. 5.

The electronic components 2 are housed in the case 4 and the wiring material W is electrically connected to the electronic components 2. The electronic components 2 include a plurality of components. The electronic components 2 include, for example, a connector, a fuse, a relay, a capacitor, a branching part, an electronic control unit, and an electronic component unit in which these are unified. In the example illustrated here, the electronic components 2 include a relay and a printed circuit board connector (PCB connector).

The substrate 3 is provided with the electronic components 2, and is housed in the case 4 together with the electronic components 2. To the substrate 3, the wiring material W is electrically connected. The substrate 3 has a mount surface 3a on which the electronic components 2 are mounted and an electronic circuit electrically connecting these electronic components 2 is formed. Here, the substrate 3 is, for example, what is called a printed circuit board (PCB). In the substrate 3, a wiring pattern (print pattern) of a conductive material such as copper is printed on an insulting layer including an insulating material such as epoxy resin, glass epoxy resin, paper epoxy resin, or ceramics, and with the use of this wiring pattern, a circuit body is formed. By electrically connecting a lead wire or a terminal of the electronic components 2 to the circuit body of the substrate 3 with solder or the like, the electronic components 2 are mounted on the mount surface 3a. On the substrate 3, for example, a substrate mount connector of the electronic components 2 is fitted to a counterpart connector C. This counterpart connector C is provided at an end of the wiring material W. With this structure, the substrate 3 is electrically connected to the wiring material W through the counterpart connector C, and through the circuit body, the other electronic components 2 and the wiring material W are electrically connected to each other. The substrate 3 is not limited to the printed circuit board and may be what is called an insert bus bar board incorporating a bus bar of a conductive metal material inside an insulating resin material. In this case, for example, the substrate 3 is formed by covering a bus bar, which corresponds to the circuit body including a conductive metal material, with an insulating resin material.

The case 4 includes the main case 41 and the lower case 42 that are provided to face each other along the thickness direction Z, and a housing space 43 that is internally formed by the main case 41 and the lower case 42. The case 4 houses the electronic components 2 and the substrate 3 in the housing space 43. The case 4 has a two-layer separate structure in which the main case 41 and the lower case 42 are separable. The case 4 has a shape like a hollow box as a whole by the combination of the main case 41 and the lower case 42, and the housing space 43 is formed in the hollow shape. The main case 41 and the lower case 42 are formed of insulating synthetic resin. The case 4 includes locking parts 44, 45 that are locked in the locking holes H1, H2 of the fixing object surface P1. Here, the locking parts 44, 45 are provided to the lower case 42. The case 4 is fixed to the fixing object surface P1 by having the locking parts 44, 45 locked in the locking holes H1, H2 of the fixing object surface P1. In the case 4 according to the present embodiment, the main case 41 includes a first protrusion 46 and the lower case 42 includes a second protrusion 47 and abutting parts 48. This structure enables the substrate 3 to be sandwiched and held for sure in the housing space 43.

More specifically, the main case 41 forms the case 4 together with the lower case 42, and parts described below are integrated into the main case 41. The main case 41 is a member with a shape like a dish (tray). The main case 41 includes a side wall portion 41a and a bottom portion 41b, and by the integration of the side wall portion 41a and the bottom portion 41b, the hollow box shape is formed. The side wall portion 41a is a frame-shaped wall body that forms the housing space 43. The side wall portion 41a has a polygonal cylindrical shape, and here, has an approximately rectangular cylindrical shape. The bottom portion 41b is a plate-shaped bottom body that forms the housing space 43. The bottom portion 41b covers one opening of the side wall portion 41a (opening opposite to the lower case 42 side in the thickness direction Z). The bottom portion 41b has a polygonal plate-like shape, and here, has an approximately rectangular plate-like shape. The bottom portion 41b forms a plate-shaped portion provided with the first protrusion 46 or the like described below. In addition, the main case 41 is provided with a plurality of locking concave portions 41c on an inner surface side of the side wall portion 41a.

The lower case 42 forms the case 4 together with the main case 41, and parts described below are integrated into the lower case 42. The lower case 42 is a member with a shape like a dish (tray). The lower case 42 includes a side wall portion 42a and a bottom portion 42b, and by the integration of the side wall portion 42a and the bottom portion 42b, the hollow box shape is formed. The side wall portion 42a is a frame-shaped wall body that forms the housing space 43. The side wall portion 42a has a polygonal cylindrical shape, and here, has an approximately rectangular cylindrical shape. The bottom portion 42b is a plate-shaped bottom body that forms the housing space 43. The bottom portion 42b covers one opening of the side wall portion 42a (opening opposite to the main case 41 side in the thickness direction Z). The bottom portion 42b has a polygonal plate-like shape, and here, has an approximately rectangular plate-like shape. The bottom portion 42b forms a plate-shaped portion provided with the second protrusion 47, the abutting parts 48, a surrounding rib part 49, and the like. In addition, the lower case 42 is provided with a plurality of locking claw portions 42c on an outer surface side of the side wall portion 42a.

In the case 4, the main case 41 and the lower case 42 are assembled to each other in a positional relation that an opening of the main case 41 on one side in the thickness direction Z and an opening of the lower case 42 on the other side in the thickness direction Z face each other along the thickness direction Z. Here, in the case 4, each locking concave portion 41c of the main case 41 and each locking claw portion 42c of the lower case 42 are locked with each other, so that the main case 41 and the lower case 42 are assembled to each other. The case 4 has an approximately rectangular parallelepiped shape as a whole by the mutual assembling between the main case 41 and the lower case 42. In the case 4, in a state in which the main case 41 and the lower case 42 are assembled, the side wall portion 42a enters the inside of the side wall portion 41a to cause the partial overlapping, and moreover the bottom portion 41b and the bottom portion 42b are positioned to face each other along the thickness direction Z. The case 4 has, as the housing space 43, a hollow internal space sectioned by the side wall portions 41a, 42a and the bottom portions 41b, 42b. The housing space 43 is a space to house the substrate 3 and the electronic components 2 mounted on the substrate 3.

Figure 3:
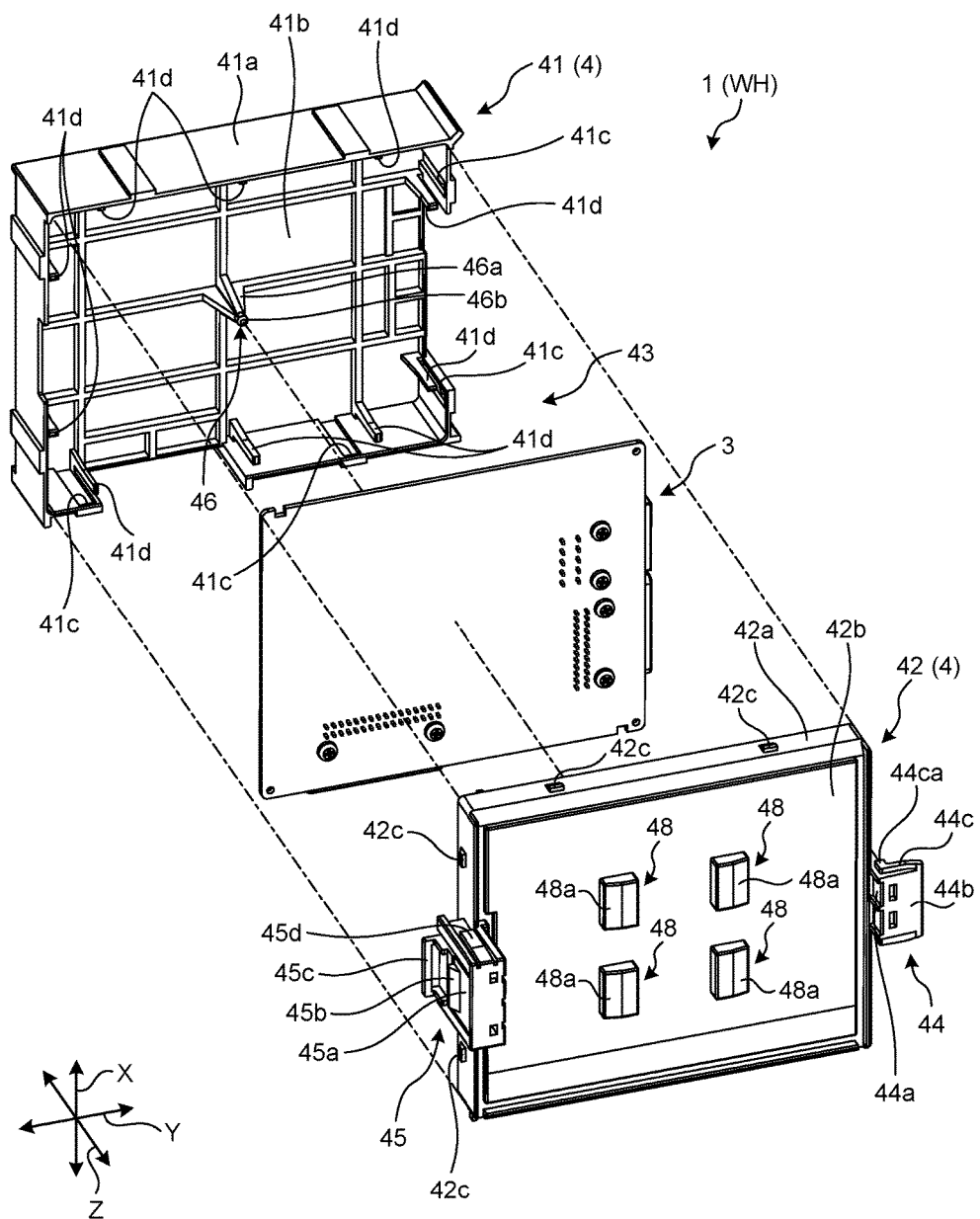
FIG. 3 is an exploded perspective view illustrating a schematic structure of the electrical connection box according to the embodiment.
Figure 5:
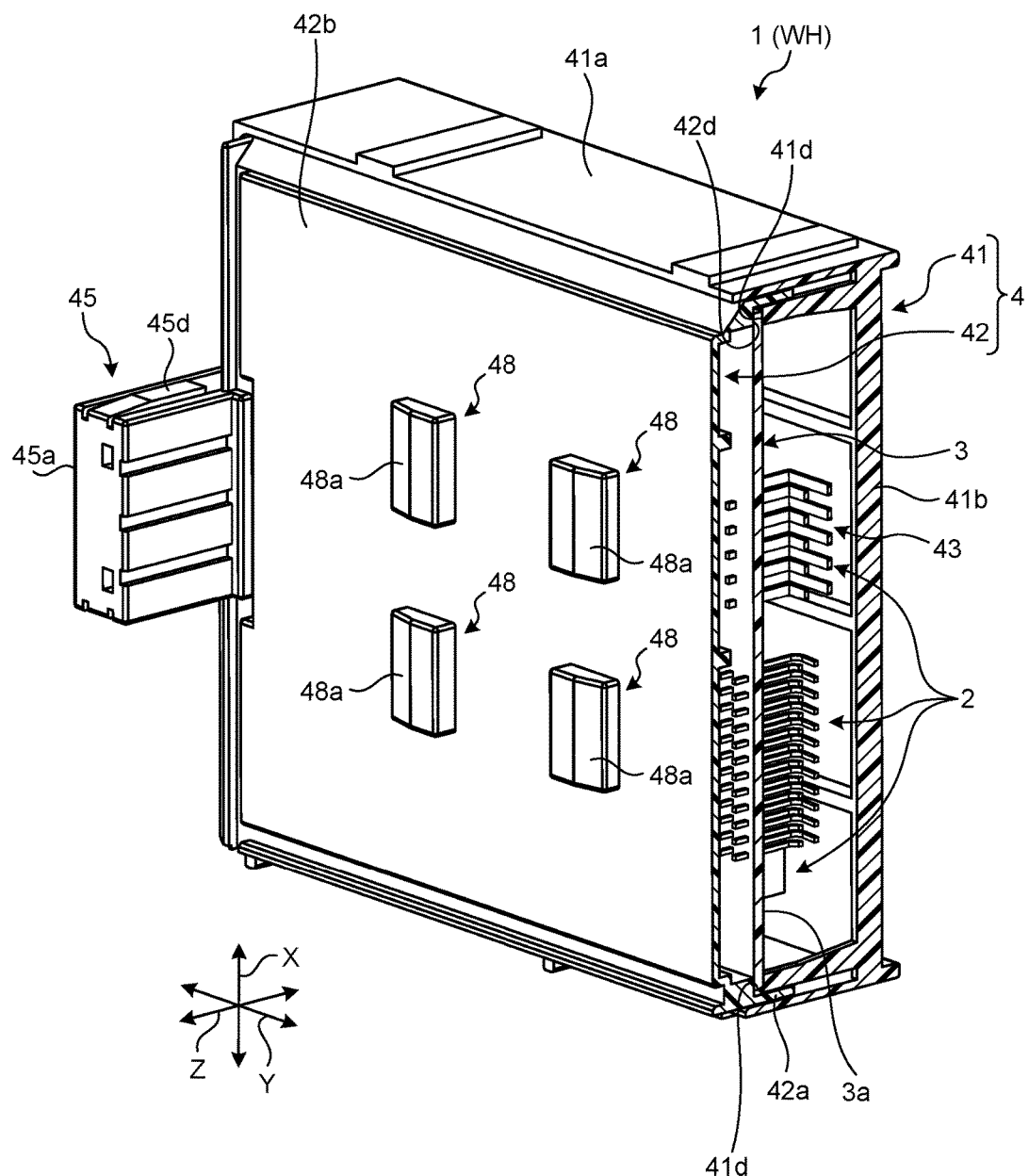
FIG. 5 is a cross-sectional perspective view illustrating a schematic structure of the electrical connection box according to the embodiment.

The main case 41 has holding rib portions 41d and the first protrusion 46 on the housing space 43 side that is surrounded by the side wall portion 41a and the bottom portion 41b (see FIG. 2, FIG. 3, FIG. 5, etc.).

The holding rib portions 41d are positioned to face the housing space 43 and formed to protrude into the housing space 43 along the thickness direction Z. The holding rib portions 41d are formed at intervals along the side wall portion 41a at an edge of the bottom portion 41b near the side wall portion 41a. Each holding rib portion 41d extends along the thickness direction Z from a surface of the bottom portion 41b on the housing space 43 side. Each holding rib portion 41d is formed as a column-shaped or wall-shaped convexity. Each holding rib portion 41d has the substrate 3 sandwiched and held between the lower case 42 and an end surface of the holding rib portion 41d in the thickness direction Z. Each holding rib portion 41d is integrated with the bottom portion 41b or the like.

The first protrusion 46 is positioned to face the housing space 43 and formed to protrude into the housing space 43 along the thickness direction Z. The single first protrusion 46 is formed at a center of the bottom portion 41b in the height direction X and the width direction Y. The first protrusion 46 extends along the thickness direction Z from the surface of the bottom portion 41b on the housing space 43 side. The first protrusion 46 is formed as a convexity (boss part) with an end portion 46b protruding from a base end portion 46a. Here, the base end portion 46a is formed to have a shape that plate pieces with an approximately triangular shape cross each other, and the end portion 46b is formed to have an approximately cylindrical shape. The first protrusion 46 has the substrate 3 sandwiched and held between the lower case 42 and an end surface of the first protrusion 46 in the thickness direction Z. The first protrusion 46 is integrated with the bottom portion 41b or the like.

Note that the main case 41 is provided with a stick-like reinforcement rib or the like in addition to the holding rib portions 41d and the first protrusion 46, on the surface of the bottom portion 41b on the housing space 43 side.

On the other hand, the lower case 42 has a holding rib portion 42d and the second protrusion 47 on the housing space 43 side that is surrounded by the side wall portion 42a and the bottom portion 42b (see FIG. 2, FIG. 4, FIG. 5, etc.).

The holding rib portion 42d is positioned to face the housing space 43 and formed to protrude into the housing space 43 along the thickness direction Z. The holding rib portion 42d is formed to have an approximately rectangular frame-like shape along the side wall portion 42a at a corner where the side wall portion 42a and the bottom portion 42b intersect (also see FIG. 6). The holding rib portion 42d is formed at such a position that the holding rib portion 42d at least partly faces each holding rib portion 41d of the main case 41 along the thickness direction Z. The holding rib portion 42d has the substrate 3 sandwiched and held between an end surface of the holding rib portion 42d in the thickness direction Z and each holding rib portion 41d of the main case 41. The holding rib portion 42d is integrated with the bottom portion 42b or the like.

The second protrusion 47 is positioned to face the housing space 43 and formed to protrude into the housing space 43 along the thickness direction Z. The single second protrusion 47 is formed at a center of the bottom portion 42b in the height direction X and the width direction Y. The second protrusion 47 extends along the thickness direction Z from the surface of the bottom portion 42b on the housing space 43 side. The second protrusion 47 is formed as a convexity (boss part) with an end portion 47b protruding from a base end portion 47a. Here, the base end portion 47a is formed to have a shape that plate pieces with an approximately rectangular shape cross each other, and the end portion 47b is formed to have an approximately cylindrical shape. The second protrusion 47 is formed at such a position that the second protrusion 47 faces the first protrusion 46 of the main case 41 along the thickness direction Z. The second protrusion 47 has the substrate 3 sandwiched and held between an end surface of the second protrusion 47 in the thickness direction Z and the first protrusion 46 of the main case 41. The second protrusion 47 is integrated with the bottom portion 42b or the like.

The lower case 42 includes the locking parts 44, 45 and the abutting parts 48 on an external space side, opposite to the housing space 43 side (see FIG. 1, FIG. 2, FIG. 4, FIG. 5, etc.).

The locking parts 44, 45 are to be locked in the locking holes H1, H2 on the fixing object surface P1. The locking parts 44, 45 are provided to the lower case 42 as a pair with a space therebetween along the width direction Y.

The locking part 44 is a first locking part to be inserted and locked in the locking hole H1 of the locking holes H1, H2. The locking part 44 includes a plate-shaped extension portion 44a, a contact portion 44b, and a spring portion 44c, and these portions are integrated with the side wall portion 42a, the bottom portion 42b, and the like of the lower case 42. The plate-shaped extension portion 44a is formed to have an approximately rectangular plate-like shape whose plate-thickness direction coincides with the width direction Y. The plate-shaped extension portion 44a is formed at a substantial center in the height direction X on one side surface of the side wall portion 42a in the width direction Y. The plate-shaped extension portion 44a is formed extending along the thickness direction Z from one side surface of the side wall portion 42a so as to protrude to the side opposite to the main case 41 side. The contact portion 44b is formed to bend approximately vertically along the width direction Y from an end portion of the plate-shaped extension portion 44a in the thickness direction Z. The contact portion 44b is formed to have an approximately rectangular plate-like shape whose plate thickness direction coincides with the thickness direction Z. The contact portion 44b is formed extending along the width direction Y from the end portion of the plate-shaped extension portion 44a in the thickness direction Z so as to protrude to the side opposite to the locking part 45. The contact portion 44b is formed to have the size that can be inserted in the locking hole H1. By inserting the contact portion 44b of the locking part 44 in the locking hole H1 and then sliding the locking part 44 along the width direction Y, the contact portion 44b is locked at the edge of the locking hole H1. The spring portion 44c is formed to have a stick-like shape. A base end portion of the spring portion 44c is supported on one side by an end portion of the contact portion 44b in the width direction Y, and the spring portion 44c extends toward the plate-shaped extension portion 44a along the width direction Y. The spring portion 44c is formed along an upper side surface of the contact portion 44b in a vertical direction (height direction X) and is supported apart from the end surface along the height direction X. The spring portion 44c has a free end portion. Since the base end portion of the spring portion 44c is supported on one side and the end portion of spring portion 44c is a free end, the spring portion 44c has relatively high flexibility with respect to the height direction X and can be elastically deformed along the height direction X. That is to say, the spring portion 44c can be bent along the height direction X. The end portion of the spring portion 44c corresponding to the free end bends approximately vertically along the thickness direction Z, so that a bent end portion 44ca is formed. The contact portion 44b is inserted in the locking hole H1 and locked at the edge of the locking hole H1, and in this state, the bent end portion 44ca of the spring portion 44c is in contact with an inner peripheral surface of the locking hole H1 and energizes and pushes the entire locking part 44 downward in the height direction X. With this energizing force (i.e., pushing force), the spring portion 44c functions to prevent the rattling between the locking part 44 and the locking hole H1 in the height direction X. Here, the spring portion 44c is provided along the upper end surface of the contact portion 44b in the height direction X (vertical direction) and not provided on the lower side in the height direction X; however, the present invention is not limited to this structure and the spring portion 44c may similarly be provided on the lower side in the height direction X to prevent the rattling.

The locking part 45 is a second locking part to be inserted and locked in the locking hole H2 of the locking holes H1, H2. The locking part 45 also includes an unlocking mechanism. The locking part 45 includes an arm portion 45a, a locking protrusion 45b, an unlocking portion 45c, and a spring portion 45d, and these portions are integrated with the side wall portion 42a, the bottom portion 42b, and the like of the lower case 42. The arm portion 45a is formed at a substantial center in the height direction X on the other side surface of the side wall portion 42a in the width direction Y (opposite to the locking part 44 side). The arm portion 45a is formed extending from the other side surface of the side wall portion 42a along the thickness direction Z so as to protrude to the side opposite to the main case 41. A base end portion of the arm portion 45a is supported on one side by the side wall portion 42a. The arm portion 45a extends in a plate-like shape to a side opposite to the main case 41 along the thickness direction Z, and moreover an end portion of the arm portion 45a extends toward the main case 41 along the thickness direction Z through a bent portion folded back toward the main case 41 in the thickness direction Z along the width direction Y. The arm portion 45a can be deformed elastically as a whole, and the arm portion 45a has a free end portion. Since the base end portion of the arm portion 45a is supported on one side and the end portion of the arm portion 45a is a free end, the arm portion 45a has relatively high flexibility in the width direction Y and can be elastically deformed along the width direction Y. That is to say, the arm portion 45a can be bent along the width direction Y. The arm portion 45a is formed to have the size that can be inserted in the locking hole H2. In the state in which the arm portion 45a is inserted in the locking hole H2, the arm portion 45a is partly in contact with an inner peripheral surface of the locking hole H2 and energizes and pushes the entire locking part 45 toward the locking part 44 in the width direction Y. With this energizing force (i.e., pushing force), the arm portion 45a functions to prevent the rattling between the locking part 45 and the locking hole H2 in the width direction Y. The locking protrusion 45b is to be locked at an edge of the locking hole H2. The locking protrusion 45b is provided to the arm portion 45a so as to protrude along the width direction Y. Here, the locking protrusion 45b is formed as an locking claw part that protrudes in a claw shape (hook shape) to a side opposite to the locking part 44 from an outer surface of the arm portion 45a between the bent portion and the end portion. In the locking part 45, by inserting the arm portion 45a in the locking hole H2 and causing the locking protrusion 45b to go over the edge of the locking hole H2 while bending the arm portion 45a, the locking protrusion 45b is locked at the edge of the locking hole H2. The unlocking portion 45c is formed in a beam-like shape at the end portion of the arm portion 45a. In the locking part 45, the locking protrusion 45b is released from the edge of the locking hole H2 when the unlocking portion 45c is pushed to bend the arm portion 45a. The spring portion 45d is formed to have a stick-like shape. A base end portion of the spring portion 45d is supported on one side by the bent portion of the arm portion 45a, and the spring portion 45d extends toward the unlocking portion 45c along the thickness direction Z. The spring portion 45d is supported inside the arm portion 45a with an approximately U-like shape apart from the arm portion 45a. The spring portion 45d has a free end portion. Since the base end portion of the spring portion 45d is supported on one side and the end portion of the spring portion 45d is a free end, the spring portion 45d has relatively high flexibility in the height direction X and can be elastically deformed along the height direction X. That is to say, the spring portion 45d can be bent along the height direction X. In the spring portion 45d, in the state in which the arm portion 45a is inserted in the locking hole H2 and the locking protrusion 45b is locked at the edge of the locking hole H2, the spring portion 45d is in contact with the inner peripheral surface of the locking hole H2 and energizes and pushes the entire locking part 45 downward in the height direction X. With this energizing force (i.e., pushing force), the spring portion 45d functions to prevent the rattling between the locking part 45 and the locking hole H2 in the height direction X. Here, the spring portion 45d is provided along the upper end surface of the bent portion of the arm portion 45a in the height direction X (vertical direction) and not provided on the lower side in the height direction X; however, the present invention is not limited to this structure and the spring portion 45d may similarly be provided on the lower side in the height direction X to prevent the rattling.

The abutting parts 48 are formed along the thickness direction Z at the bottom portion 42b of the lower case 42 on the side opposite to the housing space 43 side, that is, formed to protrude outward. In the state in which the locking parts 44, 45 are locked to the fixing object surface P1 and the case 4 is assembled to the fixing object surface P1, the abutting parts 48 are in contact with the fixing object surface P1 and generate a pushing force F1 along the thickness direction Z, so as to have the substrate 3 sandwiched between the first protrusion 46 and the second protrusion 47. The pushing force F1 is the force to have the substrate 3 sandwiched between the first protrusion 46 and the second protrusion 47 in the thickness direction Z. The abutting parts 48 in the present embodiment are provided at a position to surround the second protrusion 47 when viewed along the thickness direction Z (i.e., thickness-direction view) (also see FIG. 6). Based on the second protrusion 47 (used as a center), the four abutting parts 48 are provided substantially symmetrically in the height direction X and the width direction Y. Furthermore, the two abutting parts 48 are positioned to face each other along the width direction Y, and the other two abutting parts 48 are positioned to face those abutting pats 48 along the height direction X. Each abutting part 48 is positioned between the pair of locking parts 44, 45 while being sandwiched between the pair of locking parts 44, 45 along the width direction Y. In other words, the locking parts 44, 45 are provided to the lower case 42 as a pair having each abutting part 48 sandwiched therebetween along the width direction Y. Each abutting part 48 is formed integrated with the bottom portion 42b and the like of the lower case 42. Each abutting part 48 is formed to protrude from the bottom portion 42b to the side opposite to the housing space 43 side along the thickness direction Z, that is, outward in an approximately rectangular columnar shape. Here, each abutting part 48 is formed to have an approximately rectangular parallelepiped shape whose long side is in the height direction X and short side is in the width direction Y. The amount of protruding of each abutting part 48 in the thickness direction Z is determined so that the pushing force F1 that can have the substrate 3 sandwiched between the first protrusion 46 and the second protrusion 47 as appropriate is generated in a state in which the locking parts 44, 45 are locked to the fixing object surface P1. Here, each abutting part 48 has a tapered surface 48a inclined in a direction where the corner is cut off, at an outer end in the width direction Y (on the locking parts 44, 45 side) on the basis of the second protrusion 47.

The lower case 42 includes, on a surface of the bottom portion 42b on the housing space 43 side, a stick-like reinforcement rib in addition to the holding rib portion 42d and the second protrusion 47. In addition, the lower case 42 according to the present embodiment includes the surrounding rib part 49 on the surface of the bottom portion 42*b* on the housing space 43 side as illustrated in FIG. 4 and FIG. 6. The surrounding rib part 49 is provided at a position to surround the second protrusion 47 and overlap with the abutting parts 48 when viewed along the thickness direction Z. The surrounding rib part 49 is formed to protrude from the bottom portion 42*b* toward the housing space 43 along the thickness direction Z, that is, to the inside. Here, the surrounding rib part 49 is formed to have an approximately rectangular frame-like shape (approximately square frame-like shape) so as to surround the second protrusion 47 by four stick-like rib portions 49*a*, 49*b*, 49*c*, and 49*d* on the basis of the second protrusion 47. More specifically, the surrounding rib part 49 is formed to have an approximately rectangular frame-like shape so that the rib portions 49*a*, 49*c* are formed along the width direction Y and the rib portions 49*b*, 49*d* are formed along the height direction X. Here, the surrounding rib part 49 is provided so that each of the rib portions 49*a*, 49*b*, 49*c*, and 49*d* overlaps with each abutting part 48 on an outer end portion of each abutting part 48 on the basis of the second protrusion 47 when viewed along the thickness direction Z. In other words, the abutting parts 48 are provided so that each abutting part 48 comes to the corresponding apex of the surrounding rib part 49 formed with the approximately rectangular frame-like shape to surround the second protrusion 47 by the four rib portions 49*a*, 49*b*, 49*c*, and 49*d*.

In the electrical connection box 1 with the structure as above, the main case 41 and the lower case 42 are assembled to each other because each locking concave portion 41*c* and each locking claw portion 42*c* are locked with each other in a state in which the substrate 3 is sandwiched between the main case 41 and the lower case 42 along the thickness direction Z. In this case, in the electrical connection box 1, the substrate 3 is sandwiched and held between the holding rib portion 41*d* and the first protrusion 46 of the main case 41 and the holding rib portion 42*d* and the second protrusion 47 of the lower case 42 in a positional relation that the mount surface 3*a* of the substrate 3 faces the main case 41 in the thickness direction Z. In the electrical connection box 1 with this structure, the substrate 3 is sandwiched and held between the main case 41 and the lower case 42 in the housing space 43 of the case 4, and the substrate 3 and the electronic components 2 mounted on the substrate 3 are housed in the housing space 43. In this state of the electrical connection box 1, the second protrusion 47 is in what is called a zero-touch state relative to the substrate 3, or a small gap is formed between the second protrusion 47 and the substrate 3.

Then, in the electrical connection box 1, by inserting the contact portion 44*b* of the locking part 44 in the locking hole H1 of the fixing object surface P1 and then sliding the entire electrical connection box 1 along the width direction Y, the contact portion 44*b* is locked at the edge of the locking hole H1. Here, since each abutting part 48 has the tapered surface 48*a*, the corner of each abutting part 48 is not abutted on the fixing object surface P1; thus, this electrical connection box 1 can improve the workability of locking the locking part 44 in the locking hole H1. In the electrical connection box 1, by inserting the arm portion 45*a* of the locking part 45 in the locking hole H2 and causing the locking protrusion 45*b* to go over the edge of the locking hole H2 while bending the arm portion 45*a*, the locking protrusion 45*b* is locked at the edge of the locking hole H2. As a result, in the electrical connection box 1, the entire case 4 is fixed to the fixing object surface P1 by having the locking parts 44, 45 locked in the locking holes H1, H2 of the fixing object surface P1.

In the electrical connection box 1, the rattling in the parts can be prevented as below in a state in which the locking parts 44, 45 are locked in the locking holes H1, H2 of the fixing object surface P1. That is to say, in the electrical connection box 1, the energizing force by the arm portion 45*a* can prevent the rattling between the locking part 45 and the locking hole H2 in the width direction Y and suppress the rattling in the width direction Y as illustrated by an arrow L1 in FIG. 1. In addition, in the electrical connection box 1, the energizing force by the spring portion 44*c* can prevent the rattling between the locking part 44 and the locking hole H1 in the height direction X and suppress the rattling in the height direction X as illustrated by an arrow L2 in FIG. 1. Moreover, in the electrical connection box 1, the energizing force by the spring portion 45*d* can prevent the rattling between the locking part 45 and the locking hole H2 in the height direction X and suppress the rattling in the height direction X as illustrated by an arrow L3 in FIG. 1. Furthermore, in the electrical connection box 1, the pushing force F1 generated by each abutting part 48 can prevent the rattling between the locking surface of the contact portion 44*b* and the edge of the locking hole H1 in the thickness direction Z and suppress the rattling in the thickness direction Z as illustrated by an arrow L4 in FIG. 2. In addition, in the electrical connection box 1, the pushing force F1 generated by each abutting part 48 can prevent the rattling between the locking surface of the locking protrusion 45*b* and the edge of the locking hole H2 in the thickness direction Z and suppress the rattling in the thickness direction Z as illustrated by an arrow L5 in FIG. 2.

In the electrical connection box 1, in a state in which the locking parts 44, 45 are locked in the locking holes H1, H2 of the fixing object surface P1, the pushing force F1 generated by each abutting part 48 can bend the bottom portion 42*b* along the thickness direction Z as illustrated by an arrow L6 in FIG. 2. That is to say, the bottom portion 42*b* of the lower case 42 forms a plate-shaped portion that can be bent along the thickness direction Z by the pushing force F1 generated by each abutting part 48. Here, in the electrical connection box 1, since the surrounding rib part 49 is formed to surround the second protrusion 47, the bending can be concentrated on the second protrusion 47 at the bottom portion 42*b* as illustrated by an arrow L7 in FIG. 6. Further, in the electrical connection box 1, the second protrusion 47, the substrate 3, and the first protrusion 46 can be pushed along the thickness direction Z by the pushing force F1 generated by each abutting part 48 as above, and this enables the substrate 3 to be sandwiched for sure between the second protrusion 47, and the first protrusion 46. As a result, in the electrical connection box 1, the pushing force F1 generated by each abutting part 48 can prevent the rattling between the end portion 47*b* of the second protrusion 47 and the substrate 3, and between the substrate 3 and the end portion 46*b* of the first protrusion 46, and suppress the rattling of the substrate 3 along the thickness direction Z.

In the electrical connection box 1 and the wire harness WH described above, the substrate 3 provided with the electronic components 2 is housed in the housing space 43 formed by the main case 41 and the lower case 42 of the case 4. In the electrical connection box 1, the case 4 housing the substrate 3 is locked to the fixing object surface P1 through the locking parts 44, 45. In this case, in the electrical connection box 1, in a state in which the locking parts 44, 45 are locked to the fixing object surface P1, each abutting part 48 of the lower case 42 abuts on the fixing object surface P1 and generates the pushing force F1 along the thickness direction Z. In the electrical connection box 1 with this structure, the substrate 3 can be sandwiched for sure between the first protrusion 46 of the main case 41 and the second protrusion 47 of the lower case 42 by the pushing force F1 generated by each abutting part 48. As a result, in the panel-fixed type electrical connection box as the electrical connection box 1 and the wire harness WH, the rattling can be suppressed.

In addition, in the electrical connection box 1 and the wire harness WH described above, the abutting parts 48 are provided at positions to surround the second protrusion 47. This structure enables the electrical connection box 1 to absorb the excessive pushing force F1 using the bending of the bottom portion 42b of the lower case 42, so that the excessive pushing force F1 on the second protrusion 47 can be suppressed. As a result, in the electrical connection box 1 and the wire harness WH, the substrate 3 can be sandwiched and held between the first protrusion 46 of the main case 41 and the second protrusion 47 of the lower case 42 for sure by the appropriate pushing force F1, and thus the rattling can be suppressed as appropriate.

More specifically, in the electrical connection box 1 and the wire harness WH described above, by using the bending of the bottom portion 42b of the lower case 42 along the thickness direction Z due to the pushing force F1, the substrate 3 can be sandwiched and held between the first protrusion 46 and the second protrusion 47 as appropriate. In the electrical connection box 1, the surrounding rib part 49 overlaps with each abutting part 48 and surrounds the second protrusion 47; thus, the bending can be concentrated on the second protrusion 47 at the bottom portion 42b. In the electrical connection box 1 with this structure, the pushing force F1 generated by each abutting part 48 can be added effectively to the second protrusion 47 through the surrounding rib part 49 without diffusion. In this point, in the electrical connection box 1 and the wire harness WH, the substrate 3 can be sandwiched and held for sure between the first protrusion 46 of the main case 41 and the second protrusion 47 of the lower case 42 and the rattling can be suppressed as appropriate.

Here, in the electrical connection box 1 and the wire harness WH described above, the locking parts 44, 45 are provided to the lower case 42 as a pair with each abutting part 48 held therebetween; thus, the rattling of each part can be suppressed as appropriate.

The electrical connection box and the wire harness according to the embodiment of the present invention described above are not limited to the above embodiment, and various changes are possible in the range described in the scope of claims.

Although the pair of locking holes H1, H2 is provided with a space along the width direction Y in the above description, the present invention is not limited to this structure. The pair of locking holes H1, H2 may be positioned along the height direction X, or may be positioned in a direction inclined relative to the width direction Y and the height direction X.

Although the locking object parts of the attachment panel P where the locking parts 44, 45 are locked are the locking holes H1, H2 formed penetrating the attachment panel P in the above description, the present invention is not limited thereto. The locking object part may be a concavity that opens to the fixing object surface P1 without penetrating the attachment panel P.

In the above description, the locking parts 44, 45 are provided to the lower case 42; however, the locking parts 44, 45 may alternatively be provided to the main case 41.

In the above description, the abutting parts 48 are provided to surround the second protrusion 47; however, the present invention is not limited to this structure. For example, one abutting part 48 may be provided at a position to face the second protrusion 47 along the thickness direction Z.

In the electrical connection box and the wire harness according to the present embodiment, the substrate provided with the electronic components is housed in the housing space formed by the first member and the second member in the case. In the electrical connection box, the case housing the substrate is locked to a fixing object surface through the locking part. In this case, in the electrical connection box, in a state in which the locking part is locked to the fixing object surface, the abutting part of the second member abuts on the fixing object surface and generates a pushing force along the opposite direction. In the electrical connection box with this structure, the substrate can be sandwiched for sure between the first protrusion of the first member and the second protrusion of the second member by the pushing force generated by the abutting part. As a result, the electrical connection box and the wire harness can obtain the advantageous effect that rattling can be suppressed.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electrical connection box comprising:
   a substrate provided with an electronic component; and
   a case including a housing space that is formed inside by a first member and a second member facing each other along an opposite direction and that houses the substrate, and a locking part that is locked to a fixing object surface intersecting with the opposite direction, wherein
   the first member includes a first protrusion formed to protrude into the housing space along the opposite direction, and
   the second member includes a second protrusion formed to face the first protrusion along the opposite direction and to protrude into the housing space, and an abutting part that is formed to protrude to a side opposite to the housing space along the opposite direction, abuts on the fixing object surface in a state in which the locking part is locked to the fixing object surface, generates a pushing force along the opposite direction, and sandwiches the substrate between the first protrusion and the second protrusion.

2. The electrical connection box according to claim 1, wherein
   a plurality of the abutting parts are provided at a position in which the abutting parts surround the second protrusion when viewed along the opposite direction.

3. The electrical connection box according to claim 2, wherein
   the second member includes:
   a plate-shaped portion that is formed to have a plate-like shape, is provided with the second protrusion and the abutting part, and is bendable along the opposite direction by the pushing force generated by the abutting part; and a surrounding rib part that is provided at a position in which the surrounding rib part surrounds the second protrusion and overlaps with the abutting parts when viewed along the opposite direction, and is formed to protrude from the plate-shaped portion toward the housing space along the opposite direction.

4. The electrical connection box according to claim 1, wherein
a pair of the locking parts are provided to the second member sandwiching the abutting part along a direction intersecting with the opposite direction.

5. The electrical connection box according to claim 2, wherein
a pair of the locking parts are provided to the second member sandwiching the abutting part along a direction intersecting with the opposite direction.

6. The electrical connection box according to claim 3, wherein
a pair of the locking parts are provided to the second member sandwiching the abutting part along a direction intersecting with the opposite direction.

7. A wire harness comprising:
a conductive wiring material; and
an electrical connection box electrically connected to the wiring material, wherein
the electrical connection box includes a substrate provided with an electronic component electrically connected to the wiring material, and a case including a housing space that is formed inside by a first member and a second member facing each other along an opposite direction and that houses the substrate, and a locking part that is locked to a fixing object surface intersecting with the opposite direction,
the first member includes a first protrusion formed to protrude into the housing space along the opposite direction, and
the second member includes a second protrusion formed to face the first protrusion along the opposite direction and to protrude into the housing space, and an abutting part that is formed to protrude to a side opposite to the housing space along the opposite direction, abuts on the fixing object surface in a state in which the locking part is locked to the fixing object surface, generates a pushing force along the opposite direction, and sandwiches the substrate between the first protrusion and the second protrusion.

* * * * *